US009477423B2

(12) United States Patent
Cai et al.

(10) Patent No.: US 9,477,423 B2
(45) Date of Patent: Oct. 25, 2016

(54) ELIMINATING OR REDUCING PROGRAMMING ERRORS WHEN PROGRAMMING FLASH MEMORY CELLS

(71) Applicant: Seagate Technology LLC, Cupertino, CA (US)

(72) Inventors: Yu Cai, San Jose, CA (US); Yunxiang Wu, Cupertino, CA (US); Zhengang Chen, San Jose, CA (US); Erich Haratsch, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/094,900

(22) Filed: Dec. 3, 2013

(65) Prior Publication Data

US 2015/0149698 A1 May 28, 2015

Related U.S. Application Data

(60) Provisional application No. 61/909,211, filed on Nov. 26, 2013.

(51) Int. Cl.
*G06F 3/06* (2006.01)
*G11C 11/56* (2006.01)

(52) U.S. Cl.
CPC .......... *G06F 3/065* (2013.01); *G11C 11/5628* (2013.01)

(58) Field of Classification Search
CPC .... G06F 3/0619; G06F 3/0688; G06F 3/065; G11C 11/5628; G11C 16/34
USPC .......... 711/103
See application file for complete search history.

(56) References Cited

U.S. PATENT DOCUMENTS 7,594,157 B2 9/2009 Choi et al.
7,602,642 B2 10/2009 Choi
7,721,147 B2 5/2010 Yoon
7,755,950 B2 * 7/2010 Yu et al. .......... 365/185.28
8,923,045 B2 * 12/2014 Goss et al. .......... 365/185.02
9,007,839 B2 * 4/2015 Lee et al. .......... 365/185.18

* cited by examiner

*Primary Examiner* — Jasmine Song
(74) *Attorney, Agent, or Firm* — Robert A. Blaha; Smith Tempel Blaha LLC

(57) ABSTRACT

Mis-programming of MSB data in flash memory is avoided by maintaining a copy of LSB page data that has been written to flash memory and using the copy rather than the LSB page data read out of the flash cells in conjunction with the MSB values to determine the proper reference voltage ranges to be programmed into the corresponding flash cells. Because the copy is free of errors, using the copy in conjunction with the MSB values to determine the proper reference voltage ranges for the flash cells ensures that mis-programming of the reference voltage ranges will not occur.

24 Claims, 7 Drawing Sheets

ELIMINATING OR REDUCING PROGRAMMING ERRORS WHEN PROGRAMMING FLASH MEMORY CELLS

CROSS-REFERENCE TO RELATED APPLICATIONS

This nonprovisional application claims priority to provisional application Ser. No. 61/909,211, filed on Nov. 26, 2013, and entitled "ELIMINATING OR REDUCING PROGRAMMING ERRORS WHEN PROGRAMMING FLASH MEMORY CELLS," which is incorporated by reference herein in its entirety.

TECHNICAL FIELD OF INVENTION

The invention relates generally to flash memory controllers and, more specifically, to reducing or eliminating misprogramming occurrences when programming flash memory cells.

BACKGROUND OF THE INVENTION

A flash memory is a non-volatile electrically erasable data storage device that evolved from electrically erasable programmable read-only memory (EEPROM). The two main types of flash memory are named after the logic gates that their storage cells resemble: NAND and NOR. NAND flash memory is commonly used in solid-state drives, which are supplanting magnetic disk drives in many applications. A NAND flash memory is commonly organized as multiple blocks, with each block organized as multiple pages. Each page comprises multiple cells. Each cell is capable of storing an electric charge. Some cells are used for storing data bits, while other cells are used for storing error-correcting code bits. A cell configured to store a single bit is known as a single-level cell (SLC). A cell configured to store two bits is known as a multi-level cell (MLC). In an MLC cell, one bit is commonly referred to as the least-significant bit (LSB), and the other as the most-significant bit (MSB). A cell configured to store three bits is known as a triple-level cell (TLC). Writing data to a flash memory is commonly referred to as "programming" the flash memory, due to the similarity to programming an EEPROM.

The electric charge stored in a cell can be detected in the form of a cell voltage. To read an SLC flash memory cell, the flash memory controller provides one or more reference voltages (also referred to as read voltages) to the flash memory device. Detection circuitry in the flash memory device will interpret the bit as a "0" if the cell voltage is greater than a reference voltage Vref and will interpret the bit as a "1" if the cell voltage is less than the reference voltage Vref. Thus, an SLC flash memory requires a single reference voltage Vref. In contrast, an MLC flash memory requires three such reference voltages, and a TLC flash memory requires seven such reference voltages. Thus, reading data from an MLC or TLC flash memory device requires that the controller provide multiple reference voltages having optimal values that allow the memory device to correctly detect the stored data values.

Determining or detecting stored data values using controller-provided reference voltages is hampered by undesirable physical non-uniformity across cells of a device that are inevitably introduced by the fabrication process, as such non-uniformity results in the reference voltages of different cells that store the same bit value being significantly different from each other. The detection is further hampered by target or optimal reference voltages changing over time due to adverse effects of changes in temperature, interference from programming neighboring cells, and numerous erase-program cycles. Errors in detecting stored data values are reflected in the performance measurement known as bit error rate (BER). The use of error-correcting codes (ECCs) can improve BER to some extent, but the effectiveness of ECCs diminishes as improved fabrication processes result in smaller cell features.

As illustrated in FIG. 1, an MLC flash memory has four cell voltage distributions 2, 4, 6 and 8 with four respective mean target cell voltages Vtarget0 12, Vtarget1 14, Vtarget2 16 and Vtarget3 18. Such cell voltage distributions commonly overlap each other slightly, but such overlap is not shown in FIG. 1 for purposes of clarity. During a read operation, to attempt to characterize or detect the two bits of cell data (i.e., the LSB and MSB) a flash memory device (not shown) uses three reference voltages it receives from a flash memory controller (not shown): Vref0 22, Vref1 24 and Vref2 26. More specifically, the flash memory device compares the cell voltage with Vref1 24 to attempt to detect the LSB. If the flash memory device determines that the cell voltage is less than Vref1 24, i.e., within a window 28, then the flash memory device characterizes the LSB as a "1". If the flash memory device determines that the cell voltage is greater than Vref1 24, i.e., within a window 30, then the flash memory device characterizes the LSB as a "0".

The flash memory device also compares the cell voltage with Vref0 22 and Vref2 26 to attempt to detect the MSB. If the flash memory device determines that the cell voltage is between Vref0 22 and Vref2 26, i.e., within a window 32, then the flash memory device characterizes the MSB as a "0". If the flash memory device determines that the cell voltage is either less than Vref0 22 or greater than Vref2 26, i.e., within a window 34, then the flash memory device characterizes the MSB as a "1".

To improve BER beyond what is commonly achievable with hard-decoded ECCs, flash memory controllers may employ soft-decoded ECCs, such as low density parity check (LDPC) ECCs. Soft decoding is more powerful in correcting errors than hard decoding, but soft input information must be provided to the ECC decoding logic. The ECC decoder soft input information is commonly provided in the form of log likelihood ratio (LLR) information.

MLC NAND flash memory is programmed in two stages, namely, a first stage during which LSB page programming is performed, and a second stage during which MSB page programming is performed. The first stage includes the following: (1) the flash memory controller sends LSB data to flash memory; (2) the flash memory loads the LSB data into an LSB page buffer portion of the flash memory; and (3) the flash memory uses the LSB data to program the corresponding LSB page of the flash memory. The second stage includes the following: (1) the flash memory controller sends the MSB data to be programmed to flash memory; (2) the flash memory loads the MSB data into an MSB page buffer portion of the flash memory; (3) logic of the flash memory reads the LSB page of the corresponding flash cells and loads the read LSB data into the LSB page buffer portion; (4) the logic uses the MSB and LSB value pairs held in the flash page buffer to determine the target reference voltage ranges to be programmed for the corresponding flash cells; and (5) the logic programs the target reference voltage ranges into the flash memory.

As flash memory technology improves, the sizes of the flash dies scale down, which results in the distance between neighboring flash cells becoming smaller. Because of the nearness of neighboring flash cells to one another, the programming of one flash cell can affect the charges stored on nearby flash cells, which contributes to the potentially noisy and unreliable nature of flash cells. Consequently, there can be errors in the LSB page data read out of the corresponding flash cells. Because the LSB page data read out of the flash cells is used in combination with the MSB page data to determine the target reference voltage ranges for the corresponding cells, such errors will typically cause the target reference voltage ranges to be incorrectly determined. This can cause the flash cells to be mis-programmed to improper reference voltage ranges when performing MSB page programming. The improper reference voltage ranges often will be far away from the borders of flash neighbor states and could provide incorrect, but highly confident, soft information. This, in turn, can significantly degrade the error correction performance of soft decoding, such as LDPC decoding.

FIG. 2 illustrates cell voltage distributions and target reference voltage ranges for different LSB and MSB states and demonstrates the manner in which the reference voltage ranges are selected based on the values of the MSB and LSB pair. Cell voltage distribution 42 represents the LSB and MSB erased program state. Cell distributions 43 and 44 represent LSB "1" and "0" programmed states, respectively. Cell distributions 45, 46, 47, and 48 represent MSB programmed states of "1," "0," "0," and "1," respectively.

If the MSB and LSB values of the MSB, LSB pair contained in the flash page buffer are both "1," then the reference voltage range that will be programmed into the flash memory for the corresponding flash cells is selected to be range A, which is the range of reference voltages that is less than Vref0. If the MSB and LSB values of the MSB, LSB pair contained in the flash page buffer are "1" and "0," respectively, then the reference voltage range that will be programmed into the flash memory device for the corresponding flash cells is selected to be range D, which is the range of reference voltages that is greater than Vref2. If the MSB and LSB values of the MSB, LSB pair contained in the flash page buffer are "0" and "1," respectively, then the reference voltage range that will be programmed into the flash memory device for the corresponding flash cells is selected to be range B, which is the range of reference voltages that is greater than Vref0 and less than Vref1.

As can be seen from the above, if the LSB values that are read from the flash cells are inaccurate, which is possible for the reasons described above, then the reference voltage ranges will likely be mis-programmed. Accordingly, a need exists for a way of ensuring that the reference voltage ranges are correctly determined and programmed.

SUMMARY OF THE INVENTION

Embodiments of the invention relate to a data storage system and methods used therein for reducing programming errors when programming flash memory. In accordance with an illustrative embodiment, the data storage system comprises a host system and an SSD device that are interfaced with one another. The host system includes at least one host processor that controls operations of the host system and a host memory device that stores data and computer instructions that are used by the host processor. The SSD device includes an SSD controller and at least one nonvolatile memory (NVM). The SSD controller includes at least one SSD processor and at least one buffer. The NVM includes at least a first flash memory having a plurality of flash cells for storing data and reference voltage determination logic. The SSD controller receives write data from the host system to be programmed into flash cells and buffers the write data in the buffer prior to programming the write data into the flash cells. The buffered write data comprises at least a first MSB page of data and at least a first LSB page of data. The SSD controller sends the first LSB page of data to the first flash memory and maintains a copy of the first LSB page of data in a temporary memory. Subsequent to sending the first LSB page of data to the first flash memory, the SSD controller sends the copy of the first LSB page of data and the first MSB page of data to the first flash memory. The reference voltage determination logic of the first flash memory uses the copy of the first LSB page of data and the first MSB page of data to determine reference voltage ranges to be programmed into a first MSB page of the flash cells of the first flash memory.

The method comprises the following steps:

in a host system, sending write data to be programmed in flash cells to a SSD device interfaced with the host system;

in an SSD controller of the SSD device, receiving the write data from the host system and buffering the write data in a buffer of an SSD controller of the SSD device, where the buffered write data comprises at least a first MSB page of data and at least a first LSB page of data;

in the SSD controller, sending at least the first LSB page of data to the first flash memory and maintaining a copy of the first LSB page of data in a temporary memory;

in the first flash memory, programming at least the first LSB page of data in a first LSB page of flash cells of the first flash memory;

in the SSD controller, sending the copy of the first LSB page of data to the first flash memory;

in the SSD controller, sending the first MSB page of data to the first flash memory; and in reference voltage determination logic of the first flash memory, using the copy of the first LSB page of data and the first MSB page of data to determine reference voltage ranges to be programmed into a first MSB page of the flash cells of the first flash memory.

Embodiments of the invention also include a computer program comprising computer instructions for execution by one or more processors of an SSD controller of an SSD device of a data storage system. The computer instructions are stored on a non-transitory computer-readable medium. The computer instructions comprise:

a first set of instructions for receiving write data in the SSD controller sent from a host system;

a second set of instructions for buffering the write data in a buffer of the SSD controller, where the buffered write data comprises at least a first MSB page of data and at least a first LSB page of data;

a third set of instructions for sending at least the first LSB page of data to the first flash memory;

a fourth set of instructions for maintaining a copy of the first LSB page of data in a temporary memory; and a fifth set of instructions for sending the copy of the first LSB page of data and the first MSB page of data to a first flash memory after the third set of instructions has sent at least the first LSB page of data to the first flash memory.

These and other features and advantages of the invention will become apparent from the following description, drawings and claims.

DETAILED DESCRIPTION OF AN ILLUSTRATIVE EMBODIMENT

Figure 1:
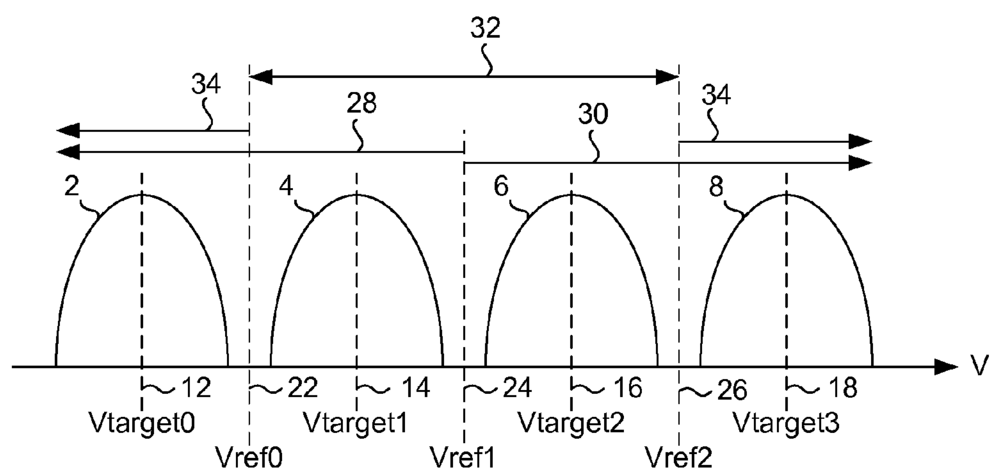
FIG. 1 is a plot of cell voltage distributions in a flash memory device, as known in the art, and demonstrates the known manner in which LSB and MSB values are determined.

In accordance with exemplary, or illustrative, embodiments, the LSB values that are used in conjunction with the MSB values to determine the proper reference voltage ranges are not read from the corresponding flash cells, but are buffered copies of the LSB values that were written to the flash cells. The buffered copies are free of errors, and therefore using them in conjunction with the MSB values to determine the proper reference voltage ranges for the flash cells ensures that mis-programming of the reference voltage ranges will not occur. Embodiments of the invention can be implemented in a number of ways, and so a few illustrative embodiments are described below with reference to FIGS. 3-7, in which like reference numerals in the figures are used to identify like features, components or elements. Before describing specific embodiments for ensuring that programming errors do not occur when programming the reference voltage ranges of the flash cells, the components of the storage system and the functions that they perform will be generally described with reference to FIG. 3.

Figure 3:
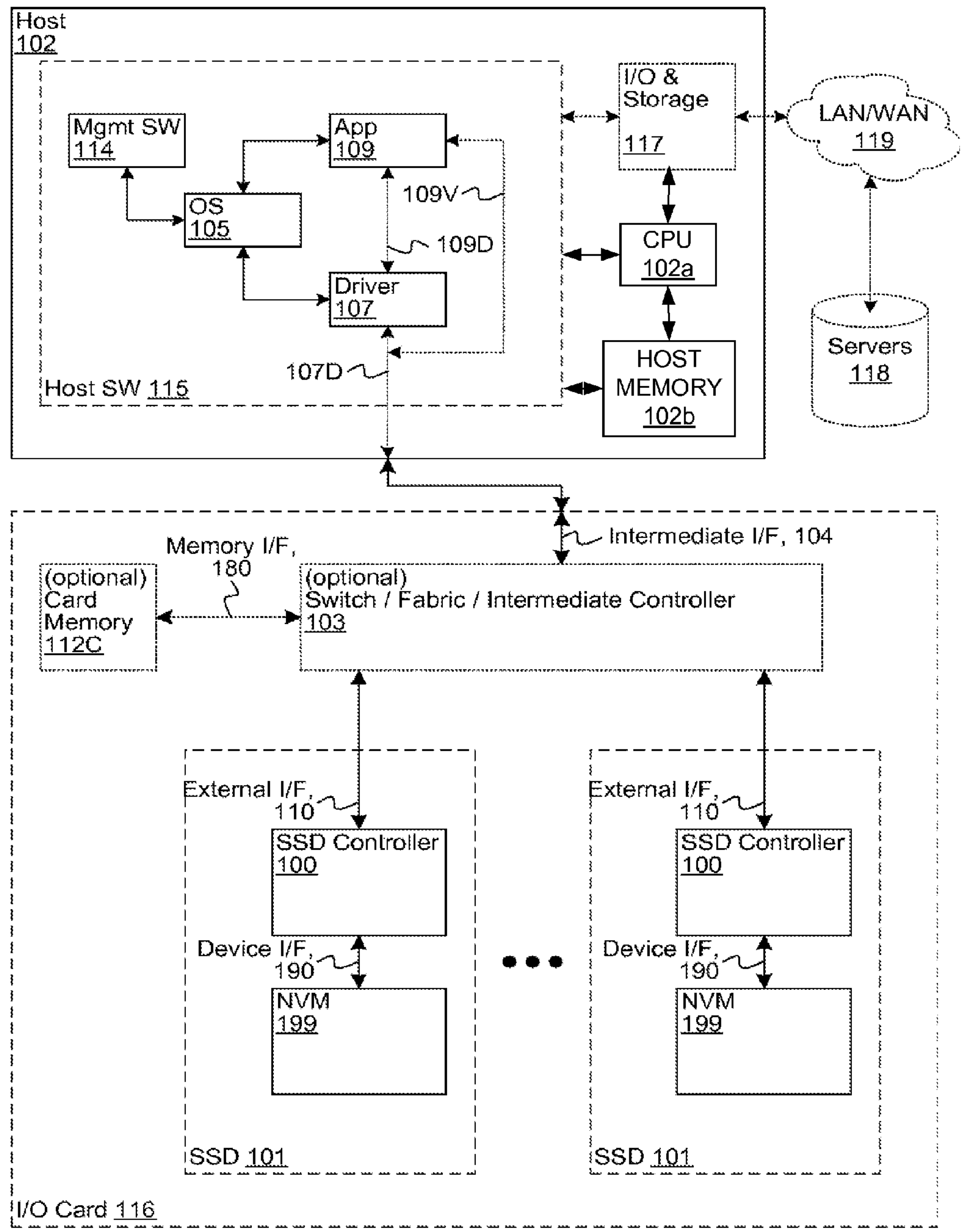
FIG. 3 illustrates a block diagram of a storage system in accordance with an illustrative embodiment that includes one or more instances of an SSD device that is suitable for implementing the invention.

FIG. 3 illustrates a block diagram of a storage system in accordance with an illustrative embodiment that includes one or more instances of a solid state drive (SSD) 101 that implements the invention. The SSD 101 includes an SSD controller 100 coupled to NVM 199 via device interfaces 190. As will be described below in more detail with reference to FIG. 4, the NVM 199 comprises one or more flash memory dies, each of which comprises a plurality of flash cells. The storage system may include, for example, a host system 102, a single SSD 101 coupled directly to the host system 102, a plurality of SSDs 101 each respectively coupled directly to the host system 102 via respective external interfaces, or one or more SSDs 101 coupled indirectly to a host system 102 via various interconnection elements. As an exemplary embodiment of a single SSD 101 coupled directly to the host system 102, one instance of SSD 101 is coupled directly to host system 102 via external interfaces 110 (e.g., switch/fabric/intermediate controller 103 is omitted, bypassed, or passed-through).

As an exemplary embodiment of a plurality of SSDs 101 being coupled directly to the host system 102 via respective external interfaces, each of a plurality of instances of SSD 101 is respectively coupled directly to host system 102 via a respective instance of external interfaces 110 (e.g., switch/fabric/intermediate controller 103 is omitted, bypassed, or passed-through). As an exemplary embodiment of one or more SSDs 101 coupled indirectly to host system 102 via various interconnection elements, each of one or more instances of SSD 101 is respectively coupled indirectly to host system 102 via a respective instance of external interfaces 110 coupled to switch/fabric/intermediate controller 103, and intermediate interfaces 104 coupled to host system 102.

The host system 102 includes one or more processors, such as, for example, one or more microprocessors and/or microcontrollers operating as a central processing unit (CPU) **102*a*, and a host memory device 102*b* for storing instructions and data used by the host CPU 102*a*. Host system 102 is enabled or configured via the host CPU 102*a* to execute various elements of host software 115, such as various combinations of operating system (OS) 105, driver 107, application 109, and multi-device management software 114. The host software 115 is stored in a memory device 102*b* of the host system 102 and is executed by the host CPU 102*a*. Dotted-arrow 107D is representative of host software ←→ I/O device communication, e.g., data sent/received to/from one or more of the instances of SSD 101 and from/to any one or more of OS 105 via driver 107, driver 107, and application 109, either via driver 107**, or directly as a VF.

OS 105 includes and/or is enabled or configured to operate with drivers (illustrated conceptually by driver 107) for interfacing with the SSD. Various versions of Windows (e.g., 95, 98, ME, NT, XP, 2000, Server, Vista, and 7), various versions of Linux (e.g., Red Hat, Debian, and Ubuntu), and various versions of MacOS (e.g., 8, 9 and X) are examples of OS 105. In various embodiments, the drivers are standard and/or generic drivers (sometimes termed "shrink-wrapped" or "pre-installed") operable with a standard interface and/or protocol such as SATA, AHCI, or NVM Express, or are optionally customized and/or vendor specific to enable use of commands specific to SSD 101.

Some drives and/or drivers have pass-through modes to enable application-level programs, such as application 109 via optimized NAND Access (sometimes termed ONA) or direct NAND Access (sometimes termed DNA) techniques, to communicate commands directly to SSD 101, enabling a customized application to use commands specific to SSD 101 even with a generic driver. ONA techniques include one or more of: use of non-standard modifiers (hints); use of vendor-specific commands; communication of non-standard statistics, such as actual NVM usage according to compressibility; and other techniques. DNA techniques include one or more of: use of non-standard commands or vendor-specific providing unmapped read, write, and/or erase access to the NVM; use of non-standard or vendor-specific commands providing more direct access to the NVM, such as by bypassing formatting of data that the I/O device would otherwise do; and other techniques. Examples of the driver are a driver without ONA or DNA support, an ONA-enabled driver, a DNA-enabled driver, and an ONA/DNA-enabled driver. Further examples of the driver are a vendor-provided, vendor-developed, and/or vendor-enhanced driver, and a client-provided, client-developed, and/or client-enhanced driver.

Examples of the application-level programs are an application without ONA or DNA support, an ONA-enabled application, a DNA-enabled application, and an ONA/DNA-enabled application. Dotted-arrow 109D is representative of application ←→ I/O device communication (e.g. bypass via a driver or bypass via a VF for an application), e.g. an ONA-enabled application and an ONA-enabled driver communicating with an SSD, such as without the application using the OS as an intermediary. Dotted-arrow 109V is representative of application ←→ I/O device communication (e.g. bypass via a VF for an application), e.g. a DNA-enabled application and a DNA-enabled driver communicating with an SSD, such as without the application using the OS or the driver as intermediaries.

Some of the embodiments that include switch/fabric/intermediate controller 103 also include card memory 112C coupled via memory interface 180 and accessible by the SSDs 101. In various embodiments, one or more of the SSDs 101, the switch/fabric/intermediate controller 103, and/or the card memory 112C are included on a physically identifiable module, card, or pluggable element (e.g., I/O Card 116). In some embodiments, SSD 101 (or variations thereof) corresponds to a SAS drive or a SATA drive that is coupled to an initiator operating as host system 102.

In some embodiments lacking the switch/fabric/intermediate controller, the SSD 101 is coupled to the host system 102 directly via external interfaces 110. In various embodiments, SSD Controller 100 is coupled to the host system 102 via one or more intermediate levels of other controllers, such as a RAID controller. In some embodiments, SSD 101 (or variations thereof) corresponds to a SAS drive or a SATA drive and switch/fabric/intermediate controller 103 corresponds to an expander that is in turn coupled to an initiator, or alternatively switch/fabric/intermediate controller 103 corresponds to a bridge that is indirectly coupled to an initiator via an expander. In some embodiments, switch/fabric/intermediate controller 103 includes one or more PCIe switches and/or fabrics.

In various embodiments, such as some of the embodiments where host system 102 is a computing host (e.g., a computer, a workstation computer, a server computer, a storage server, a SAN, a NAS device, a DAS device, a storage appliance, a PC, a laptop computer, a notebook computer, and/or a netbook computer), the computing host is optionally enabled to communicate (e.g., via optional I/O & Storage Devices/Resources 117 and optional LAN/WAN 119) with one or more local and/or remote servers (e.g., optional servers 118). The communication enables, for example, local and/or remote access, management, and/or usage of any one or more of SSD 101 elements. In some embodiments, the communication is wholly or partially via Ethernet. In some embodiments, the communication is wholly or partially via Fibre Channel. LAN/WAN 119 is representative, in various embodiments, of one or more Local and/or Wide Area Networks, such as any one or more of a network in a server farm, a network coupling server farms, a metro-area network, and the Internet.

In various embodiments, an SSD controller and/or a computing-host flash memory controller in combination with one or more NVMs are implemented as a non-volatile storage component, such as a USB storage component, a CF storage component, an MMC storage component, an eMMC storage component, a Thunderbolt storage component, a UFS storage component, an SD storage component, a memory stick storage component, and an xD-picture card storage component.

In various embodiments, all or any portions of an SSD controller (or a computing-host flash memory controller), or functions thereof, are implemented in a host that the controller is to be coupled with (e.g., host system 102). In various embodiments, all or any portions of an SSD controller (or a computing-host flash memory controller), or functions thereof, are implemented via hardware (e.g., logic circuitry), software and/or firmware (e.g., driver software or SSD control firmware), or any combination thereof.

Figure 4:
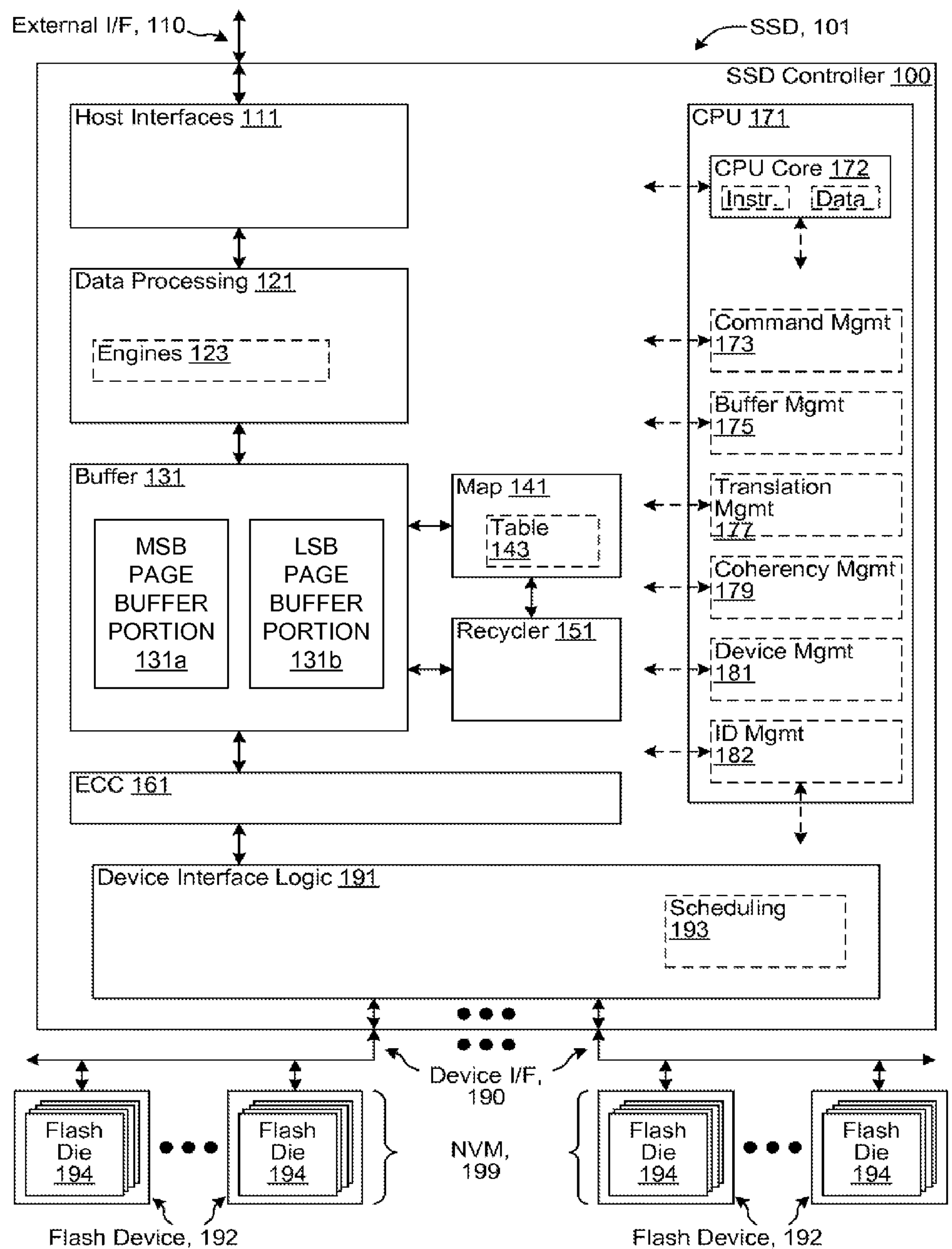
FIG. 4 illustrates a block diagram of an illustrative embodiment of one of the SSDs shown in FIG. 3 including the SSD controller shown in FIG. 3 that performs flash cell programming in a way that ensures that programming errors do not occur when programming the reference voltage ranges of the flash cells.

FIG. 4 illustrates a block diagram of an illustrative embodiment of one of the SSDs 101 shown in FIG. 3 including the SSD controller 100 shown in FIG. 3 that performs flash cell programming in a way that ensures that programming errors do not occur when programming the reference voltage ranges of the flash cells. Prior to describing an illustrative embodiment of the manner in which the SSD controller 100 performs flash cell programming, the configuration of the SSD controller 100 that is suitable for performing the methods will be described with reference to FIG. 4.

SSD controller 100 is communicatively coupled via one or more external interfaces 110 to the host system 102 (FIG. 3). According to various embodiments, external interfaces 110 are one or more of: a SATA interface; a SAS interface; a PCIe interface; a Fibre Channel interface; an ethernet interface (such as 10 Gigabit Ethernet); a non-standard version of any of the preceding interfaces; a custom interface; or any other type of interface used to interconnect storage and/or communications and/or computing devices. For example, in some embodiments, SSD controller 100 includes a SATA interface and a PCIe interface.

SSD controller 100 is further communicatively coupled via one or more device interfaces 190 to NVM 199, which includes one or more flash devices 192. According to various illustrative embodiments, device interfaces 190 are one or more of: an asynchronous interface; a synchronous interface; a single-data-rate (SDR) interface; a double-data-rate (DDR) interface; a DRAM-compatible DDR or DDR2 synchronous interface; an ONFI compatible interface, such as an ONFI 2.2 or ONFI 3.0 compatible interface; a Toggle-mode compatible flash interface; a non-standard version of any of the preceding interfaces; a custom interface; or any other type of interface used to connect to storage devices.

Each flash device 192 includes one or more individual flash dies 194. According to type of a particular one of flash devices 192, a plurality of the flash die 194 in the particular flash device 192 is optionally and/or selectively accessible in parallel. Flash device 192 is merely representative of one type of storage device enabled to communicatively couple to SSD controller 100. In various embodiments, any type of storage device is usable, such as an SLC NAND flash memory, MLC NAND flash memory, NOR flash memory, flash memory using polysilicon or silicon nitride technology-based charge storage cells, two- or three-dimensional technology-based flash memory, read-only memory, static random access memory, dynamic random access memory, ferromagnetic memory, phase-change memory, racetrack memory, ReRAM, or any other type of memory device or storage medium.

According to various embodiments, device interfaces 190 are organized as: one or more busses with one or more of flash device 192 per bus; one or more groups of busses with one or more of flash device 192 per bus, where busses in a group are generally accessed in parallel; or any other organization of one or more of flash device 192 onto device interfaces 190.

The SSD controller 100 typically, but not necessarily, has one or more modules, such as, for example, host interfaces module 111, data processing module 121, buffer module 131, map module 141, recycler module 151, ECC module 161, Device interface logic module 191, and CPU 171. The specific modules and interconnections illustrated in FIG. 4 are merely representative of one embodiment, and many arrangements and interconnections of some or all of the modules, as well as additional modules not illustrated, are possible, and fewer than all of the modules shown in FIG. 4 may be included in the SSD controller 100. In a first example, in some embodiments, there are two or more host interfaces 111 to provide dual-porting. In a second example, in some embodiments, data processing module 121 and/or ECC module 161 are combined with buffer module 131. In a third example, in some embodiments, Host interfaces module 111 is directly coupled to buffer module 131, and data processing module 121 optionally and/or selectively operates on data stored in buffer module 131. In a fourth example, in some embodiments, device interface logic module 191 is directly coupled to buffer module 131, and ECC module 161 optionally and/or selectively operates on data stored in buffer module 131.

Host interfaces module 111 sends and receives commands and/or data via external interfaces 110. For example, the commands include a read command specifying an address (such as a logical block address (LBA)) and an amount of data (such as a number of LBA quanta, e.g., sectors) to read; in response the SSD 101 provides read status and/or read data. As another example, the commands include a write command specifying an address (such as an LBA) and an amount of data (such as a number of LBA quanta, e.g., sectors) to write; in response the SSD 101 provides write status and/or requests write data and optionally subsequently provides write status. For yet another example, the commands include a de-allocation command (e.g., a trim command) specifying one or more addresses (such as one or more LBAs) that no longer need be allocated.

According to various embodiments, one or more of: Data processing module 121 optionally and/or selectively processes some or all data sent between buffer module 131 and external interfaces 110; and data processing module 121 optionally and/or selectively processes data stored in buffer module 131. In some embodiments, data processing module 121 uses one or more engines 123 to perform one or more of: formatting; reformatting; transcoding; and any other data processing and/or manipulation task.

Buffer module 131 stores data sent to/from external interfaces 110 from/to device interfaces 190. In some embodiments, buffer module 131 additionally stores system data, such as some or all map tables, used by SSD controller 100 to manage one or more of the flash devices 192. In accordance with an illustrative embodiment, buffer module 131 includes an MSB page buffer portion 131*a* and an LSB page buffer portion 131*b*, which are typically portions of the local memory of the SSD controller 100 that have been allocated for use as temporary storage for storing MSB and LSB page data to be written to flash cells of the flash die 194. The buffer module 131 typically, but not necessarily, also includes a direct memory access (DMA) engine (not shown) that is used to control movement of data to and/or from the Buffer module 131 and ECC-X engine (not shown) that is used to provide higher-level error correction and/or redundancy functions.

According to various embodiments, ECC module 161 optionally and/or selectively processes some or all data sent between buffer module 131 and device interfaces 190. ECC module 161 optionally and/or selectively processes data stored in buffer module 131. In some embodiments, ECC module 161 is used to provide lower-level error correction and/or redundancy functions in accordance with one or more ECC techniques. In some embodiments, ECC module 161 implements one or more of: a CRC code; a Hamming code; an RS code; a BCH code; an LDPC code; a Viterbi code; a trellis code; a hard-decision code; a soft-decision code; an erasure-based code; any error detecting and/or correcting code; and any combination of the preceding. In some embodiments, ECC module 161 includes one or more decoders (such as LDPC decoders).

Device interface logic module 191 controls instances of flash device 192 via device interfaces 190. Device interface logic module 191 is enabled to send data to/from the instances of flash device 192 according to a protocol of flash device 192. Device interface logic module 191 typically includes scheduling logic 193 that selectively sequence controls instances of flash device 192 via device interfaces 190. For example, in some embodiments, scheduling logic 193 is enabled to queue operations to the instances of flash device 192, and to selectively send the operations to individual ones of the instances of flash device 192 (or flash die 194) as individual ones of the instances of flash device 192 (or flash die 194) become available.

Map module 141 converts between data addressing used on external interfaces 110 and data addressing used on device interfaces 190, using table 143 to map external data addresses to locations in NVM 199. For example, in some embodiments, map module 141 converts LBAs used on external interfaces 110 to block and/or page addresses targeting one or more flash die 194, via mapping provided by table 143. In some embodiments, map module 141 uses table 143 to perform and/or to look up translations between addresses used on external interfaces 110 and data addressing used on device interfaces 190. According to various embodiments, table 143 is one or more of: a one-level map; a two-level map; a multi-level map; a map cache; a compressed map; any type of mapping from one address space to another; and any combination of the foregoing. According to various embodiments, table 143 includes one or more of: static random access memory; dynamic random access memory; NVM (such as flash memory); cache memory; on-chip memory; off-chip memory; and any combination of the foregoing.

In some embodiments, recycler module 151 performs garbage collection. For example, in some embodiments, instances of flash device 192 contain blocks that must be erased before the blocks are re-writeable. Recycler module 151 is enabled to determine which portions of the instances of flash device 192 are actively in use (e.g., allocated instead of de-allocated), such as by scanning a map maintained by map module 141, and to make unused (e.g., de-allocated) portions of the instances of flash device 192 available for writing by erasing them. In further embodiments, recycler module 151 is enabled to move data stored within instances of flash device 192 to make larger contiguous portions of the instances of flash device 192 available for writing.

In some embodiments, instances of flash device 192 are selectively and/or dynamically configured, managed, and/or used to have one or more bands for storing data of different types and/or properties. A number, arrangement, size, and type of the bands are dynamically changeable. For example, data from a computing host is written into a hot (active)

band, while data from recycler module 151 is written into a cold (less active) band. In some usage scenarios, if the computing host writes a long, sequential stream, then a size of the hot band grows, whereas if the computing host does random writes or few writes, then a size of the cold band grows.

CPU 171 controls various portions of SSD controller 100. CPU module 171 typically includes CPU Core 172, which is, according to various embodiments, one or more single-core or multi-core processors. The individual processor cores in CPU core 172 are, in some embodiments, multi-threaded. CPU core 172 includes instruction and/or data caches and/or memories. For example, the instruction memory contains instructions to enable CPU core 172 to execute programs (e.g. software sometimes called firmware) to control SSD Controller 100. In some embodiments, some or all of the firmware executed by CPU core 172 is stored on instances of flash device 192.

In various embodiments, CPU 171 further includes: command management logic 173 for tracking and controlling commands received via external interfaces 110 while the commands are in progress; buffer management logic 175 for controlling allocation and use of buffer module 131; translation Management logic 177 for controlling map module 141; coherency management module 179 for controlling consistency of data addressing and for avoiding conflicts such as between external data accesses and recycle data accesses; device management logic 181 for controlling device interface logic 191; identity management logic 182 for controlling modification and communication of identity information, and optionally other management units. None, any, or all of the management functions performed by CPU 171 are, according to various embodiments, controlled and/or managed by hardware, by software (such as firmware executing on CPU core 172 or on host system 102 (FIG. 3) connected via external interfaces 110), or any combination thereof.

In various embodiments, all or any portions of an SSD Controller 100 are implemented on a single IC, a single die of a multi-die IC, a plurality of dice of a multi-die IC, or a plurality of ICs. For example, buffer module 131 may be implemented on a same die as other elements of SSD controller 100. As another example, buffer module 131 may be implemented on a different die than other elements of SSD controller 100. The SSD controller 100 and one or more of the flash devices 192 may be implemented on the same die, although they are typically implemented on separate dies.

As described above in the Background of the Invention, flash memory is typically programmed in two stages, namely, a first stage during which LSB page programming is performed and a second stage during which MSB page programming is performed. As also described above, during the second stage, errors in the LSB page data read out of the flash cells will typically cause the target reference voltage ranges to be incorrectly determined, and therefore mis-programmed. In accordance with an illustrative embodiment, the manner in which the second stage is performed has been altered to ensure that the LSB data that is used in determining the reference voltage values does not contain errors, as will now be described with reference to FIGS. 3-6.

Figure 5:
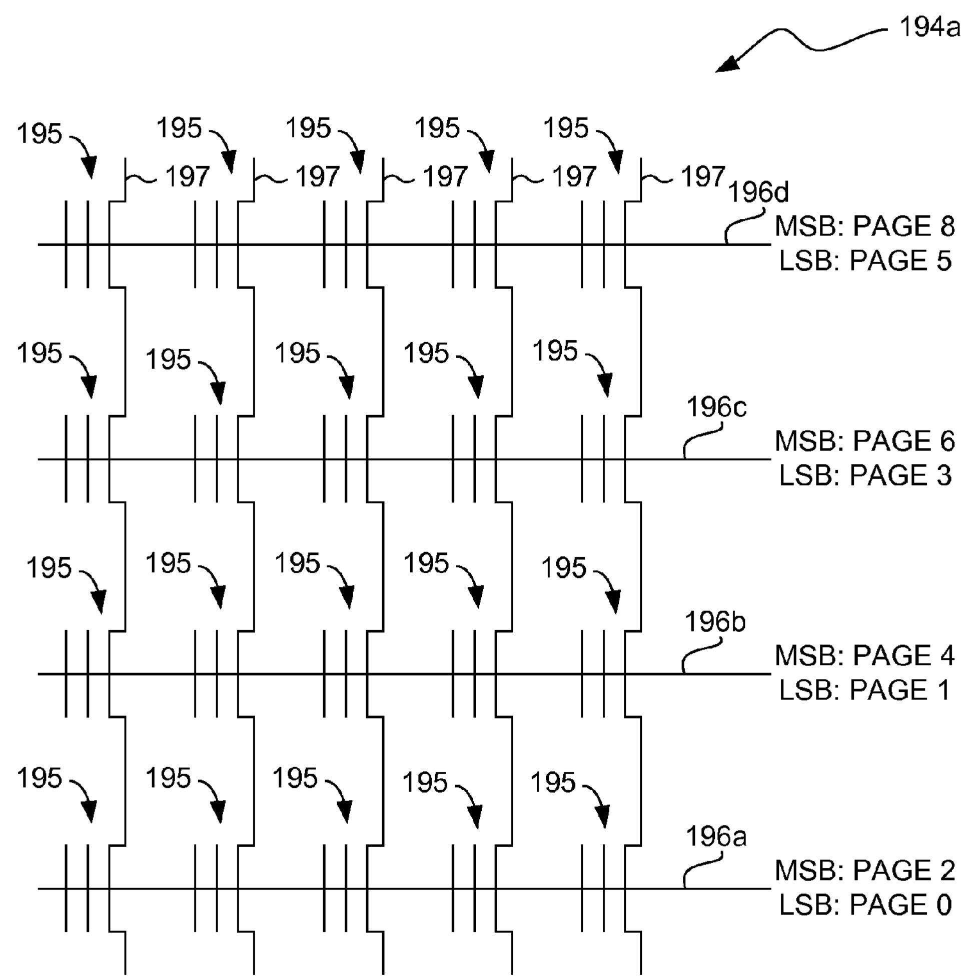
FIG. 5 illustrates a block diagram of a plurality of flash cells disposed in a portion of one of the flash die shown in FIG. 4.
Figure 6:
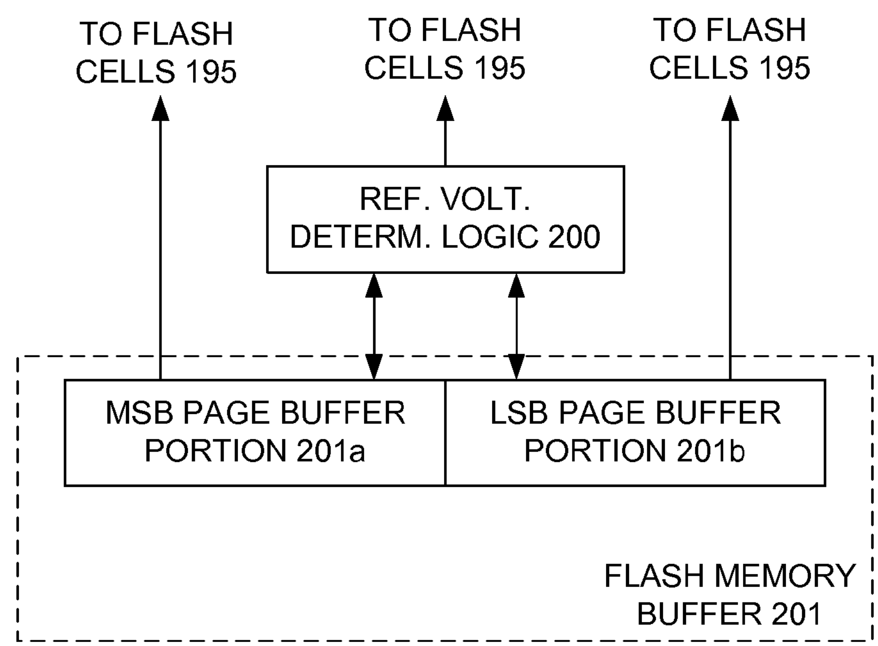
FIG. 6 illustrates a block diagram of a portion of one of the flash dies that includes logic for determining the reference voltage ranges for the flash cells of the flash die shown in FIG. 4 and a flash memory buffer for holding MSB data and LSB data to be written to the flash cells.

FIG. 5 illustrates a block diagram of a plurality of flash cells 195 disposed in a portion of one of the flash die 194 shown in FIG. 4. A plurality of word lines 196*a*-196*d* and bit lines 197 are used to address LSB and MSB pages of the flash cells 195 (FIG. 5). FIG. 6 illustrates a block diagram of a portion of one of the flash dies 194 that includes logic 200 for determining the reference voltage ranges for the flash cells 195 and a flash memory buffer 201 for holding MSB data and LSB data to be written to the flash cells 195. The logic 200 is typically a state machine, but could be some other type of logic such as a processor.

In accordance with an illustrative embodiment, the following process occurs when writing data to the flash die 194: (1) MSB and LSB data to be written is received in the SSD controller 100 from the host system 102 and loaded into the MSB and LSB page buffer portions 131*a* and 131*b* (FIG. 4), respectively, of the buffer 131 of the SSD controller 100; (2) the LSB page data contained in the LSB page buffer portion 131*a* (FIG. 4) is sent to the flash die 194 and loaded into the LSB page buffer portion 201*b* (FIG. 5) of the flash memory buffer 201; (3) the LSB data contained in the LSB page buffer portion 201*b* (FIG. 5) is written, or programmed, to the corresponding LSB page of the flash cells 195; (4) prior to sending the MSB page data contained in the MSB page buffer portion 131*a* (FIG. 4) to the flash die 194, the copy of the LSB page data contained in the LSB page buffer portion 131*b* (FIG. 4) is sent from the SSD controller 100 to the flash die 194, which loads the copy into the LSB page buffer portion 201*b* (FIG. 5) of the flash memory buffer 201; (5) the MSB page data contained in the MSB page buffer portion 131*a* (FIG. 4) is then sent to the flash die 194, which loads the MSB page data into the MSB page buffer portion 201*a* (FIG. 5) of the flash memory buffer 201; (6) the copy of the LSB page data contained in the LSB page buffer portion 201*b* (FIG. 5) and the MSB page data contained in the MSB page buffer portion 201*a* (FIG. 5) are used by the logic 200 of the flash die 194 to determine the proper reference voltage ranges for the corresponding flash cells 195 of the die 194; and (7) the logic 200 programs the corresponding flash cells 195 to the proper reference voltage ranges.

An example of the manner in which steps (1)-(7) are performed in accordance with an illustrative embodiment will now be described with reference to FIGS. 3-6. The SSD controller 100 receives data to be written to the NVM 199 from the host system 102. For example purposes, it will be assumed that eight pages of data to be written are received in the SSD controller 100 from the host system 102. It will also be assumed for example purposes, that the LSB page buffer portion 131*b* and the MSB page buffer portion 131*a* each have the capacity for storing two pages of data. The invention is not limited with respect to the size of the data that is transferred from the host system 102 to the SSD controller 100 or with respect to the storage capacity of the MSB and LSB page buffer portions 131*a* and 131*b*, respectively.

The SSD controller 100 loads MSB page 2 and MSB page 4 data into the MSB page buffer portion 131*a* and loads LSB page 0 and LSB page 1 data into the LSB page buffer portion 131*b*. The SSD controller 100 then sends LSB page 0 data contained in the LSB page buffer portion 131*b* to the flash die 194, which loads the LSB page 0 data into the LSB page buffer portion 201*b* (FIG. 5) of flash die 194. In a typical configuration of the flash die 194, the MSB and LSB page buffer portions 201*a* and 201*b* (FIG. 5), respectively, each have the capacity for holding a single page of MSB and LSB data, respectively, although the invention is not limited with respect to the storage capacity of buffer portions 201*a* and 201*b*. Logic (not shown) inside of the flash die 194 then writes the LSB page 0 data held in LSB page buffer portion 201*b* to the corresponding flash cells 195 connected to word line 196*a*.

The SSD controller 100 then sends LSB page 1 data contained in the LSB page buffer portion 131*b* to the flash die 194, which loads the LSB page 1 data into the LSB page buffer portion 201*b* (FIG. 5), thereby overwriting the LSB page 0 data. Logic (not shown) inside of the flash die 194 then writes the LSB page 1 data to corresponding flash cells 195 connected to word line 196*b*.

Figure 2:
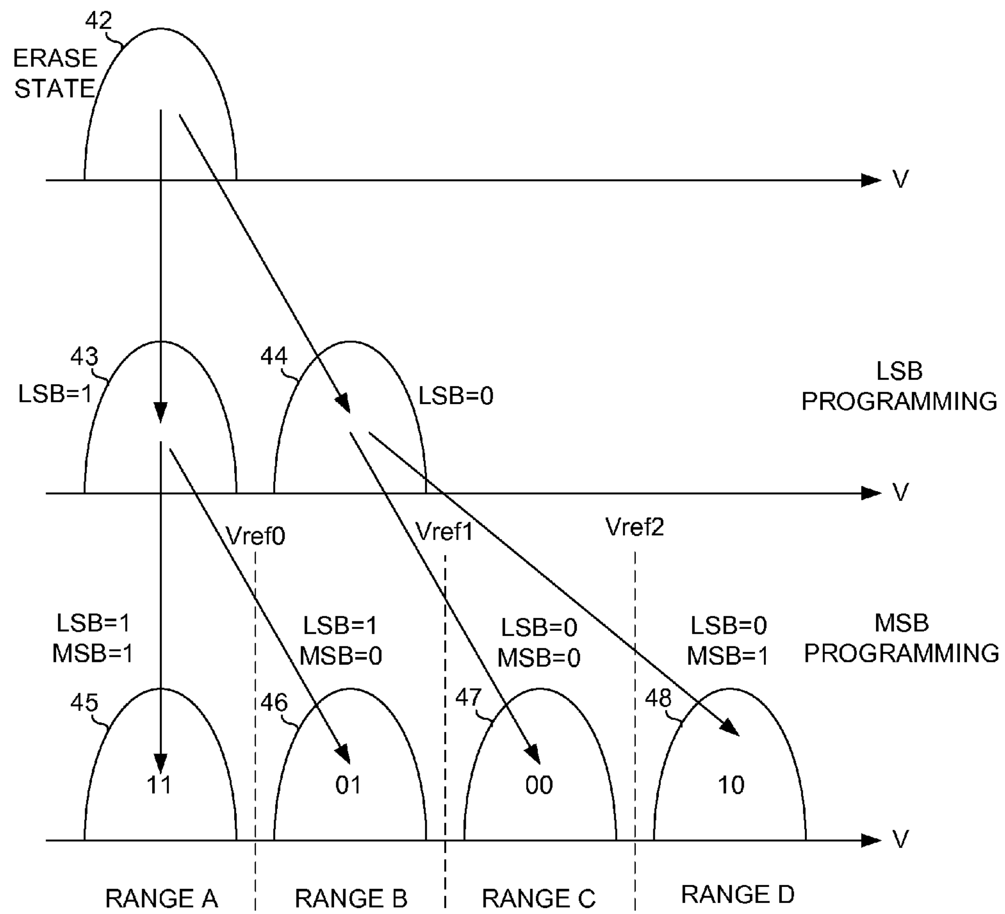
FIG. 2 is a plot of cell voltage distributions in a flash memory device, as known in the art, and demonstrates the manner in which LSB and MSB value pairs are used to determine the reference voltage ranges.

The SSD controller 100 then sends the copy of the LSB page 0 data held in the LSB page buffer portion 131*b* (FIG. 4) and the MSB page 2 data held in the MSB page buffer portion 131*a* to the flash die 194, which loads the MSB page 2 data and the LSB page 0 data into the MSB and LSB page buffer portions 201*a* and 201*b*, respectively. The logic 200 (FIG. 5) then uses the MSB page 2 value and the LSB page 0 value contained in the MSB and LSB page buffer portions 201*a* and 201*b*, respectively, to determine the proper reference voltage ranges to be programmed for the flash cells 195 connected to word line 196*a*. Because the manner in which the LSB and MSB value pair is used to determine the proper reference voltage ranges has been described above with reference to FIG. 2, it will not be described again herein in the interest of brevity.

The LSB page 0 data held in the LSB page buffer portion 131*b* can then be released to allow another LSB page of data to be stored in the LSB page buffer portion 131*b*. This frees up storage space in the LSB page buffer portion 131*b* to allow the SSD Controller 100 to load the LSB page 3 data into the LSB page buffer portion 131*b*. As soon as the MSB page 2 data is sent to the flash cells 195, the corresponding space in the MSB page buffer portion 131*a* can be freed to allow the SSD controller 100 to load in the MSB page 6 data.

The SSD controller 100 then sends LSB page 3 data contained in the LSB page buffer portion 131*b* to the flash die 194, which loads the LSB page 3 data into the LSB page buffer portion 201*b* (FIG. 5), thereby overwriting the LSB page 1 data. Logic (not shown) inside of the flash die 194 then writes the LSB page 3 data to corresponding flash cells 195 connected to word line 196*c*. The SSD controller 100 then sends the copy of the LSB page 1 data held in the LSB page buffer portion 131*b* (FIG. 4) and the MSB page 4 data held in the MSB page buffer portion 131*a* to the flash die 194, which loads the MSB page 4 data and the LSB page 1 data into the MSB and LSB page buffer portions 201*a* and 201*b* (FIG. 5), respectively. The logic 200 (FIG. 5) then uses the LSB page 1 value and the MSB page 4 value contained in the LSB and MSB page buffer portions 201*b* and 201*a*, respectively, to determine the proper reference voltage ranges to be programmed for the flash cells 195 connected to word line 196*b*.

The LSB page 1 data held in the LSB page buffer portion 131*b* can then be released to allow another LSB page of data to be stored in the LSB page buffer portion 131*b*. This frees up storage space in the LSB page buffer portion 131*b* to allow the SSD controller 100 to load the LSB page 5 data into the LSB page buffer portion 131*b*. As soon as the MSB page 4 data is been sent to the flash cells 195, the corresponding space in the MSB page buffer portion 131*a* can be freed to allow the SSD controller 100 to load in the MSB page 8 data.

The SSD controller 100 then sends LSB page 5 data contained in the LSB page buffer portion 131*b* (FIG. 4) to the flash die 194, which loads the LSB page 5 data into the LSB page buffer portion 201*b* (FIG. 5), thereby overwriting the LSB page 3 data. Logic (not shown) inside of the flash die 194 then writes the LSB page 5 data to corresponding flash cells 195 connected to word line 196*d*.

The SSD Controller 100 then sends the copy of the LSB page 3 data held in the LSB page buffer portion 131*b* (FIG. 4) and the MSB page 6 data held in the MSB page buffer portion 131*a* to the flash die 194, which loads the MSB page 6 data and the LSB page 3 data into the MSB and LSB page buffer portions 201*a* and 201*b* (FIG. 5), respectively. The logic 200 (FIG. 5) then uses the LSB page 3 value and the MSB page 6 values contained in the LSB and MSB page buffer portions 201*b* and 201*a*, respectively, to determine the proper reference voltage ranges to be programmed for the flash cells 195 connected to word line 196*c*.

The LSB page 3 data held in the LSB page buffer portion 131*b* can then be released to allow the next LSB page of data to be stored in the LSB page buffer portion 131*b*. As soon as the MSB page 6 data is sent to the flash cells 195, the corresponding space in the MSB page buffer portion 131*a* can be freed to allow the SSD Controller 100 to load in the MSB page 8 data.

The SSD Controller 100 then sends the copy of the LSB page 5 data held in the LSB page buffer portion 131*b* (FIG. 4) and the MSB page 8 data held in the MSB page buffer portion 131*a* data to the flash die 194, which loads the MSB page 8 data and the LSB page 5 data into the MSB and LSB page buffer portions 201*a* and 201*b* (FIG. 5), respectively. The logic 200 (FIG. 5) then uses the LSB page 5 value and the MSB page 8 value contained in the LSB and MSB page buffer portions 201*b* and 201*a* (FIG. 5), respectively, to determine the proper reference voltage ranges to be programmed for the flash cells 195 connected to word line 196*d*.

The LSB page 5 data held in the LSB page buffer portion 131*b* can then be released to allow the next LSB page of data to be stored in the LSB page buffer portion 131*b*. As soon as the MSB page 8 data is sent to the flash cells 195, the corresponding space in the MSB page buffer portion 131*a* can be freed to allow the SSD controller 100 to load in the next MSB page data.

It should be noted that although the MSB and LSB page buffer portions 131*a* and 131*b* have been described as having the capacity to hold two pages of data each, they can be configured to hold more than two or as few as one page of MSB and LSB data, respectively. Because memory inside of the SSD controller 100 is generally expensive, limiting the sizes of the page buffer portions 131*a* and 131*b* to two pages of MSB and LSB data each is reasonable and can be accomplished at very little or no additional cost. Likewise, the MSB and LSB page buffer portions 201*a* and 201*b*, respectively, of the flash die 194 may be configured to hold more than one page of data each, but they typically only hold one page of data each for cost efficiency.

It should also be noted that the memory that is used to hold the copy of the LSB page data after it has been written to the flash die 194 could be external to the SSD controller 100 and accessible by the SSD controller 100. For example, this memory could be inside of the host system 102 (e.g., in host memory 102*b*), or, alternatively, could by static random access memory (SRAM) or dynamic random access memory (DRAM) located inside of one or more of the flash die 194. In either case, the memory that is used for this purpose is not susceptible to the types of errors to which the flash cells 195 are susceptible, which ensures that the LSB data that is used in conjunction with the MSB data to determine the reference voltage ranges is very reliable.

Figure 7:
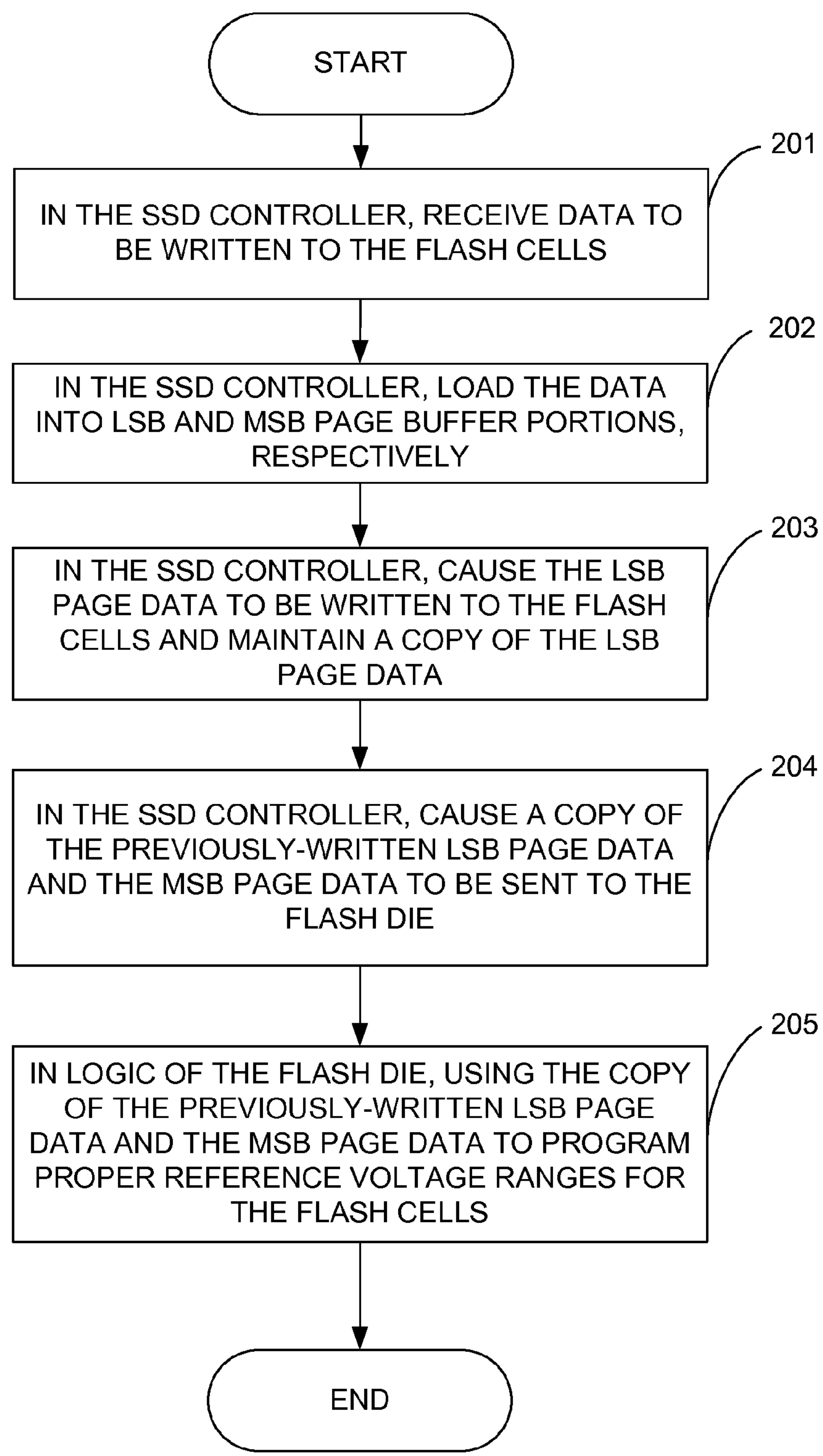
FIG. 7 illustrates a flow diagram that represents the method in accordance with an illustrative embodiment for determining proper reference voltage ranges when writing MSB data to a flash die.

FIG. 7 illustrates a flow diagram that represents the method in accordance with an illustrative embodiment for ensuring that the reference voltage ranges are properly determined when writing MSB data to flash memory. Data to be written to flash memory is received in the SSD controller 100 from the host system 102, as indicated by block 201. First and second portions of the data are loaded into LSB and MSB page buffer portions, respectively, of the buffer of the SSD controller 100, as indicated by block 202. The LSB page data contained in the LSB page buffer portion is sent to the flash die 194 and a copy of the LSB page data is temporarily maintained, as indicated by block 203. As indicated above, the memory in which the copy is maintained may be, for example, the LSB page buffer portion 131*b* located inside of the SSD controller 100 or memory that is external to the SSD Controller 100, such as in host memory 102*b* or a buffer located in the flash die 194. The SSD controller 100 then sends the copy of the previously-written LSB page data and the MSB page data to be written to the flash die, as indicated by block 204. Logic inside of the flash die (e.g., logic 200 shown in FIG. 6) then uses the received MSB page data and the received copy of the LSB page data to program the proper reference voltage ranges for the corresponding flash cells 195, as indicated by block 205.

It should be understood that the flow diagram of FIG. 7 is intended only to be exemplary or illustrative of the above-described method. In view of the descriptions herein, persons skilled in the art readily will be capable of programming or configuring an SSD controller or similar system in any of various ways to effectuate the above-described method and similar methods. The process represented by the blocks described above with regard to FIG. 7 is intended only as an example, and in other embodiments the steps or acts described above and similar steps or acts can occur in any other suitable order or sequence. Steps or acts described above can be combined with others or omitted in some embodiments. Similarly, the logic elements or components described above with regard to FIGS. 3-5 are intended only as examples of suitable configurations for performing the above-described method. Also, it should be understood that the combination of software instructions or similar logic and the memory in which such software instructions or similar logic is stored or embodied in non-transitory form comprise a "computer-readable medium" or "computer program product" as that term is used in the patent lexicon.

It should be noted that the invention has been described with reference to one or more exemplary embodiments for the purpose of demonstrating the principles and concepts of the invention. The invention is not limited to these embodiments. For example, although the above-described exemplary embodiment relates to MLC NAND flash memory, other embodiments can relate to TLC or any other suitable type of flash memory. As will be understood by persons skilled in the art, in view of the description provided herein, many variations may be made to the embodiments described herein and all such variations are within the scope of the invention.

What is claimed is:

1. A data storage system comprising:

a host system, the host system including at least one host processor that controls operations of the host system and a host memory device that stores data and computer instructions that are used by the host processor; and a solid state drive (SSD) device interfaced with the host system, the SSD device including an SSD controller and at least one nonvolatile memory (NVM), the NVM including at least a first flash memory having a plurality of flash cells for storing data, the first flash memory including reference voltage determination logic, the SSD controller including at least one SSD processor and at least one buffer, the SSD controller receiving write data from the host system to be programmed into flash cells of the NVM, the SSD controller buffering the write data in the buffer prior to programming the write data into the flash cells, the buffered write data comprising at least a first most significant bit (MSB) page of data and at least a first least significant bit (LSB) page of data, the SSD controller sending the first LSB page of data to the first flash memory and maintaining a copy of the first LSB page of data in a temporary memory, and wherein subsequent to sending the first LSB page of data to the first flash memory the SSD controller sends the copy of the first LSB page of data and sends the first MSB page of data to the first flash memory, and wherein the reference voltage determination logic uses the copy of the first LSB page of data and the first MSB page of data to determine reference voltage ranges to be programmed into a first MSB page of the flash cells of the first flash memory.

2. The data storage system of claim 1, wherein the temporary memory in which the copy is maintained is a LSB page buffer portion of the buffer of the SSD controller.

3. The data storage system of claim 2, wherein the first flash memory programs the first LSB page of data into a first page of the flash cells before the SSD controller sends the copy of the first LSB page of data and the first MSB page of data to the first flash memory.

4. The data storage system of claim 3, wherein the LSB page buffer portion has a capacity at least large enough to store the first LSB page of data and a second LSB page of data, and wherein the SSD controller buffers the first and second LSB pages of data in the LSB page buffer portion, and wherein the SSD controller sends the buffered first and second LSB pages of data to the first flash memory, and wherein the first flash memory programs the first and second LSB pages of data in first and second LSB pages of the flash cells, respectively, before the SSD controller sends the copy of the first LSB page of data and the first MSB page of data to the first flash memory.

5. The data storage system of claim 4, wherein the buffer of the SSD controller further includes an MSB page buffer portion that has a capacity at least large enough to store the first MSB page of data and a second MSB page of data, and wherein the SSD controller buffers the first and second MSB pages of data in the MSB page buffer portion prior to sending the copy of the first LSB page of data and the first MSB page of data to the flash memory.

6. The data storage system of claim 5, wherein the first flash memory further comprises:

a flash memory buffer having an LSB page buffer portion and an MSB page buffer portion, wherein the LSB and MSB page data that is sent from the SSD controller to the first flash memory is buffered in the LSB and MSB page buffer portions, respectively, of the flash memory buffer before being programmed into the respective flash cells, and wherein the copy of the first LSB page of data and the first MSB page of data that are used by the reference voltage determination logic to determine the reference voltage ranges are read from the LSB and MSB page buffer portions of the flash memory buffer by the reference voltage determination logic prior to the reference voltage determination logic determining the reference voltage ranges.

7. The data storage system of claim 1, wherein the temporary memory in which the copy is maintained is a buffer portion of the host memory device, and wherein the SSD controller causes the copy of the first LSB page data to be stored in the buffer portion of the host memory device and subsequently causes the copy to be retrieved from the host memory device and sent to the first flash memory.

8. The data storage system of claim 7, wherein the first flash memory programs the first LSB page of data into a first LSB page of the flash cells before the SSD controller sends the copy of the first LSB page of data and the first MSB page of data to the first flash memory.

9. The data storage system of claim 8, wherein the buffer of the SSD controller has an LSB page buffer portion having a capacity at least large enough to store the first LSB page of data and a second LSB page of data, and wherein the SSD controller buffers first and second LSB pages of data in the LSB page buffer portion, and wherein the SSD controller sends the buffered first and second LSB pages of data to the first flash memory, and wherein the first flash memory programs the first and second LSB pages of data in first and second LSB pages of the flash cells, respectively, before the SSD controller sends the copy of the first LSB page of data and the first MSB page of data to the first flash memory.

10. The data storage system of claim 9, wherein the buffer of the SSD controller further includes an MSB page buffer portion that has a capacity at least large enough to store the first MSB page of data and a second MSB page of data, and wherein the SSD controller buffers the first and second MSB pages of data in the MSB page buffer portion prior to sending the copy of the first LSB page of data and the first MSB page of data to the first flash memory.

11. The data storage system of claim 10, wherein the first flash memory further comprises:

a flash memory buffer having an LSB page buffer portion and an MSB page buffer portion, wherein the LSB and MSB page data that is sent from the SSD controller to the first flash die is buffered in the LSB and MSB page buffer portions, respectively, of the flash memory buffer before being programmed into the respective flash cells, and wherein the copy of the first LSB page of data and the first MSB page of data that are used by the reference voltage determination logic to determine the reference voltage ranges are read from the LSB and MSB page buffer portions of the flash memory buffer by the reference voltage determination logic prior to the reference voltage determination logic determining the reference voltage ranges.

12. The data storage system of claim 1, wherein the temporary memory in which the copy is maintained is a buffer portion of the NVM, and wherein the SSD controller causes the copy of the first LSB page data to be stored in the buffer portion of the NVM and subsequently causes the copy to be retrieved from the NVM and sent to the first flash memory.

13. The data storage system of claim 12, wherein the first flash memory programs the first LSB page of data into a first LSB page of the flash cells before the SSD controller sends the copy of the first LSB page of data and the first MSB page of data to the first flash memory.

14. The data storage system of claim 13, wherein the buffer of the SSD controller has an LSB page buffer portion having a capacity at least large enough to store the first LSB page of data and a second LSB page of data, and wherein the SSD controller buffers first and second LSB pages of data in the LSB page buffer portion, and wherein the SSD controller sends the buffered first and second LSB pages of data to the first flash memory, and wherein the first flash memory programs the first and second LSB pages of data in first and second LSB pages of the flash cells, respectively, before the SSD controller sends the copy of the first LSB page of data and the first MSB page of data to the first flash memory.

15. The data storage system of claim 14, wherein the buffer of the SSD controller further includes an MSB page buffer portion that has a capacity at least large enough to store the first MSB page of data and a second MSB page of data, and wherein the SSD controller buffers the first and second MSB pages of data in the MSB page buffer portion prior to sending the copy of the first LSB page of data and the first MSB page of data to the first flash memory.

16. The data storage system of claim 15, wherein the first flash memory further comprises:

a flash memory buffer having an LSB page buffer portion and an MSB page buffer portion, wherein the LSB and MSB page data that is sent from the SSD controller to the first flash memory is buffered in the LSB and MSB page buffer portions, respectively, of the flash memory buffer before being programmed into the respective flash cells, and wherein the copy of the first LSB page of data and the first MSB page of data that are used by the reference voltage determination logic to determine the reference voltage ranges are read from the LSB and MSB page buffer portions of the flash memory buffer by the reference voltage determination logic prior to the reference voltage determination logic determining the reference voltage ranges.

17. A method for programming flash cells of a flash memory device, the method comprising:

in a host system, sending write data to be programmed in flash cells to a solid state drive (SSD) device interfaced with the host system, the host system including at least a host processor and a host memory device, the SSD device including at least an SSD controller and at least one nonvolatile memory (NVM), the NVM including at least a first flash memory having a plurality of flash cells for storing data, the first flash memory including reference voltage determination logic, the SSD controller including at least one SSD processor and at least one buffer;

in the SSD controller, receiving the write data from the host system;

in the SSD controller, buffering the write data in the buffer, the buffered write data comprising at least a first most significant bit (MSB) page of data and at least a first least significant bit (LSB) page of data;

in the SSD controller, sending at least the first LSB page of data to the first flash memory and maintaining a copy of the first LSB page of data in a temporary memory;

in the first flash memory, programming at least the first LSB page of data in a first LSB page of flash cells of the first flash memory;

in the SSD controller, sending the copy of the first LSB page of data to the first flash memory;

in the SSD controller, sending the first MSB page of data to the first flash memory; and in the reference voltage determination logic of the first flash memory, using the copy of the first LSB page of data and the first MSB page of data to determine reference voltage ranges to be programmed into a first MSB page of the flash cells of the first flash memory.

18. The method of claim 17, wherein the step of programming the first LSB page of data in the first LSB page of the flash cells occurs before the steps of sending the copy of the first LSB page of data and sending the first MSB page of data to the first flash memory occur.

19. The method of claim 18, wherein the buffer of the SSD controller includes an LSB buffer portion and an MSB buffer portion, the LSB buffer portion having a capacity at least large enough to store the first LSB page of data and a second LSB page of data, the MSB buffer portion having a capacity at least large enough to store the first MSB page of data and a second MSB page of data, and wherein the method further comprises:

as part of the buffering step, buffering the first and second LSB pages of data in the LSB page buffer portion and buffering the first and second MSB pages of data in the MSB page buffer portion;

as part of the step of sending at least the first LSB page of data to the first flash memory, sending the buffered first and second LSB pages of data to the first flash memory; and as part of the step of programming at least the first LSB page of data in a first LSB page of flash cells, programming the first and second LSB pages of data in first and second LSB pages of the flash cells, respectively.

20. The method of claim 19, wherein the first flash memory includes a flash memory buffer having an LSB page buffer portion and an MSB page buffer portion, and wherein the method further comprises:

in the flash memory, prior to programming the first LSB page of data in the first LSB page of the flash cells, buffering the first LSB page of data in the LSB page buffer portion of the flash memory;

in the flash memory, after buffering the first LSB page of data in the LSB page buffer portion of the flash memory, using the first LSB page of data buffered in the LSB page buffer portion of the flash memory to program the first LSB page of data in the first LSB page of the flash cells;

in the flash memory, after programming the first LSB page of data in the first LSB page of the flash cells, buffering the second LSB page of data in the LSB page buffer portion of the flash memory;

in the flash memory, after buffering the second LSB page of data in the LSB page buffer portion of the flash memory, using the second LSB page of data buffered in the LSB page buffer portion of the flash memory to program the second LSB page of data in the second LSB page of the flash cells;

in the flash memory, after programming the second LSB page of data in the second LSB page of the flash cells, buffering the copy of the first LSB page data and the first MSB page data sent from the SSD controller to the first flash memory in the LSB and MSB page buffer portions, respectively, of the flash memory buffer; and in the reference voltage determination logic, prior to the reference voltage determination logic determining the reference voltage ranges, reading the copy of the first LSB page of data and the first MSB page of data from the LSB and MSB page buffer portions, respectively, of the flash memory buffer, and wherein the reference voltage determination logic uses the copy of the first LSB page of data and the first MSB page of data read from the LSB and MSB page buffer portions, respectively, of the flash memory buffer to determine the reference voltage ranges.

21. The method of claim 17, wherein the temporary memory in which the copy is maintained is a portion of the buffer of the SSD controller.

22. The method of claim 17, wherein the temporary memory in which the copy is maintained is a buffer portion of the NVM, and wherein the method further comprises:

in the SSD controller, prior to sending the copy of the first LSB page of data to the first flash memory, retrieving the copy of the first LSB page data from the buffer portion of the NVM.

23. The method of claim 17, wherein the temporary memory in which the copy is maintained is a buffer portion of the host memory device, and wherein the method further comprises:

in the SSD controller, prior to sending the copy of the first LSB page of data to the first flash memory, retrieving the copy of the first LSB page data from the buffer portion of the host memory device.

24. A computer program comprising computer instructions for execution by one or more processors of a controller of a solid state drive (SSD) device of a data storage system, the computer instructions being stored on a non-transitory computer-readable medium, the computer instructions comprising:

a first set of instructions for receiving write data in the controller sent from a host system;

a second set of instructions for buffering the write data in a buffer of the controller, the buffered write data comprising at least a first most significant bit (MSB) page of data and at least a first least significant bit (LSB) page of data;

a third set of instructions for sending at least the first LSB page of data to the first flash memory;

a fourth set of instructions for maintaining a copy of the first LSB page of data in a temporary memory;

a fifth set of instructions for sending the copy of the first LSB page of data and the first MSB page of data to a first flash memory after the third set of instructions has sent at least the first LSB page of data to the first flash memory; and a sixth set of instructions for using the copy of the first LSB page of data to determine reference voltage ranges to be programmed into a first MSB page of the flash cells of the first flash memory.

* * * * *